(12) United States Patent
Chen et al.

(10) Patent No.: US 8,773,128 B2
(45) Date of Patent: Jul. 8, 2014

(54) METHOD AND APPARATUS FOR ENHANCING SIGNAL IN MAGNETIC RESONANCE IMAGING

(75) Inventors: Jyh-Horng Chen, Taipei (TW); Tzi-Dar Chiueh, Taipei (TW); Edzer L. Wu, Taipei (TW)

(73) Assignee: National Taiwan University, Taipei (TW)

( * ) Notice: Subject to any disclaimer, the term of this patent is extended or adjusted under 35 U.S.C. 154(b) by 406 days.

(21) Appl. No.: 13/209,479

(22) Filed: Aug. 15, 2011

(65) Prior Publication Data

US 2013/0043866 A1 Feb. 21, 2013

(51) Int. Cl.
- G01V 3/00 (2006.01)
- G01R 33/483 (2006.01)
- G01R 33/565 (2006.01)

(52) U.S. Cl.
CPC ........ G01R 33/4835 (2013.01); G01R 33/5659 (2013.01)
USPC ........................................................ 324/307

(58) Field of Classification Search
USPC .................................................. 324/300–322
See application file for complete search history.

(56) References Cited

U.S. PATENT DOCUMENTS

| 8,022,701 B2 * | 9/2011 | Chen et al. .................... 324/309 |
| 2012/0235682 A1 * | 9/2012 | Chen et al. .................... 324/309 |

* cited by examiner

*Primary Examiner* — Dixomara Vargas
(74) *Attorney, Agent, or Firm* — Bacon & Thomas, PLLC

(57) ABSTRACT

A method and an apparatus for enhancing signals in magnetic resonance imaging are provided. The method includes the following steps. Applying one or more than one RF pulse, which carries at least two frequency components, and a slice/slab selection gradient to a subject, so that at least two slices/slabs of the subject respectively corresponding to the at least two frequency components are excited simultaneously. Applying a plurality of spatial encoding gradients and one or more than one separation gradients for separating the at least two slices/slabs. Receiving a plurality of responsive RF signals excited from the subject. The responsive RF signals are restored according to a signal restoration function.

14 Claims, 11 Drawing Sheets

METHOD AND APPARATUS FOR ENHANCING SIGNAL IN MAGNETIC RESONANCE IMAGING

BACKGROUND

1. Field of the Invention

The present invention relates to a method and an apparatus for enhancing signals, and more particularly to a method and an apparatus for enhancing signals in magnetic resonance imaging (MRI).

2. Background of the Invention

A magnetic resonance imaging (MRI) apparatus is configured to reconstruct MR images based on MR signals. An MRI apparatus typically applies a static magnetic field, a gradient magnetic field, and a radio frequency (RF) signal having a selected frequency to a subject to excite a selected nucleus type and then detects the MR signals responsively sent by the excited nucleus.

Referring to FIG. 1, in a conventional procedure of 2D spatial encoding, only one single slice of the subject can be processed at a time; that is, multi-slice images are acquired from multiple scans along a scan direction. Therefore, one image is obtained from one scan; N images are obtained from N times of scan. The time required for acquiring the images of all the slices can be calculated as Equation 1 (Eq. 1).

Time required for acquiring the images of all the slices $$=NEX \times N_{pe} \times TR \times N_{slice}, \quad \text{(Eq. 1)}$$

Where NEX denotes the average number of repeated signaling of a single slice, and $N_{pe}$ is the whole number of encoding. For the 2D MR image, $N_{pe}$ denotes the number of phase encoding $N_p$ (scan lines in the k-space), TR denotes the time required for acquiring a scan line in the k-space, and $N_{slice}$ denotes the number of the slices. For example, if there are on the total 256 128×128 images to be acquired, and $N_{slice}=256$, NEX=1, $N_{pe}=128$, TR=0.1 second, then the time required for acquiring the images of all the slices is about 54 minutes. This is indeed a time-consuming procedure.

Referring to FIG. 2, in a conventional procedure of 3D spatial encoding, in one scan only one single slab of the subject can be excited to give the images of all the slices. Also, the time required for acquiring the 3D MR image is calculated as Eqn. 1, but the whole number of encoding $N_{pe}=N_p \times N_z$, wherein $N_p$ is the number of phase encoding and $N_z$ is the number of phase encoding. Thus, it is apparent that more time is required for acquiring the 3D MR images.

Previous application (US Publication No. 20090278538) discloses a novel method and apparatus for simultaneously acquiring multiple slices/slabs in magnetic resonance system. The method comprises the following steps: applying one or more than one RF pulse, which carries at least two frequency components, and a slice/slab selection magnetic field gradient so that at least two slices/slabs of the subject respectively corresponding to the at least two frequency components can be excited simultaneously; applying spatial encoding magnetic field gradients; and applying a slice/slab separation magnetic field gradient so as to separate the at least two slices/slabs. The method according to the previous invention can be used to acquire data for simultaneously reconstructing multiple slices/slabs.

However, the applied spatial encoding magnetic field gradients and spatial encoding gradients generate a sin c filtering effect in the received signals and destroy high frequency component thereof, as a result, the images acquired by said method are blurry.

Therefore, how to modify the current method and apparatus for simultaneously acquiring multiple slices/slabs in magnetic resonance system as a method and an apparatus which can make the acquired images more clear has become an imminent task for the industries.

SUMMARY

The disclosure is directed to a method and an apparatus for enhancing signals in magnetic resonance imaging. The responsive RF signals are restored according to a signal restoration function, so that the acquired images are made clearer.

According to a first aspect of the present disclosure, a method for enhancing signals in MRI is provided. The method includes the following steps. Applying one or more than one RF pulse, which carries at least two frequency components, and a slice/slab selection gradient to a subject, so that at least two slices/slabs of the subject respectively corresponding to the at least two frequency components are excited simultaneously. Applying a plurality of spatial encoding gradients and one or more than one separation gradients for separating the at least two slices/slabs. Receiving a plurality of responsive RF signals excited from the subject. Restoring the responsive RF signals according to a signal restoration function.

According to a second aspect of the present disclosure, an apparatus for simultaneously acquiring multi-slice/slab MRI images from a subject is provided, wherein the apparatus being capable of imaging by generating a MRI signal from the subject, the apparatus includes an RF excitation module, a gradient output module, an RF receiving module and a restoration module. The RF excitation module, being controlled for applying one or more than one RF pulse, which carries at least two frequency components, and a slice/slab selection gradient to the subject, so that at least two slices/slabs of the subject respectively corresponding to the at least two frequency components are excited simultaneously. The gradient output module for applying a plurality of spatial encoding gradients and one or more than one separation gradients for separating the at least two slices/slabs. The RF receiving module for receiving a plurality of responsive RF signals excited from the subject. The restoration module for restoring the responsive RF signals according to a signal restoration function.

The above and other aspects of the disclosure will become better understood with regard to the following detailed description of the non-limiting embodiment(s). The following description is made with reference to the accompanying drawings.

DESCRIPTION OF THE PREFERRED EMBODIMENT

In the following description, it should be first noted that similar elements are denoted by the same numbers and, for the purpose of convenience, the symbol "/" means "or". In addition, coordinates (X, Y, Z) are used with respect to the coordinates of images but are not absolute spatial coordinates about an MRI system.

The methods described herein make it possible to simultaneously excite and acquire MR images of different locations in a subject. The provided embodiments are compatible with a variety of existing MRI systems. Moreover, they do not require extra coils/RF channels, extra time for computation of image information, or extra computer equipment. The embodiments described herein can be applied to MRI systems by means of echo planar imaging, perfusion, image flow, angiogram, image temperature, T1 imaging (lattice-spin relaxation time constant), T2 imaging (spin-spin relaxation time constant), diffusion and the like.

Figure 1:
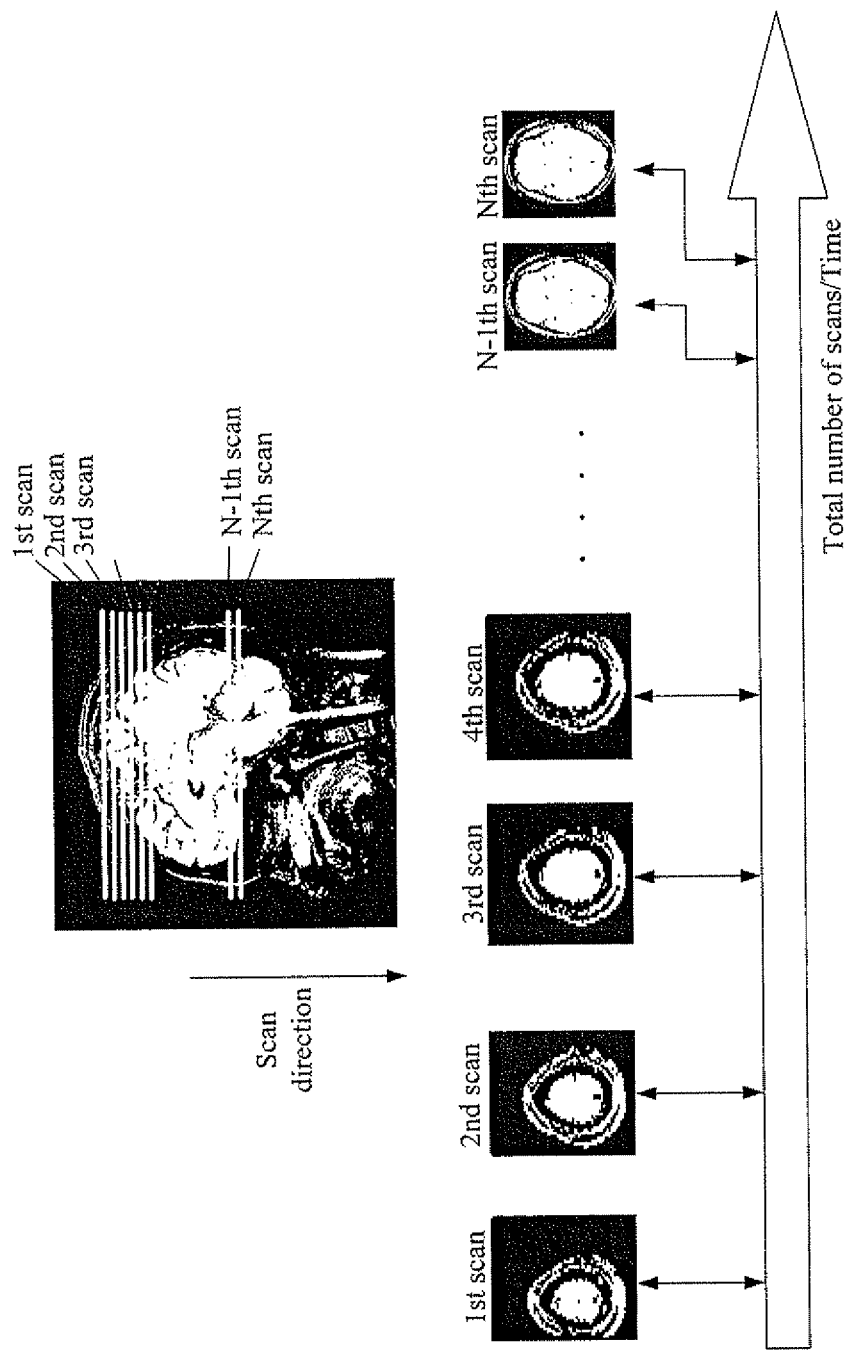
FIG. 1 is a schematic diagram, showing that, in a conventional procedure of 2D spatial encoding, only one single slice of the subject can be processed at a time and N images are given at N scans.
Figure 2:
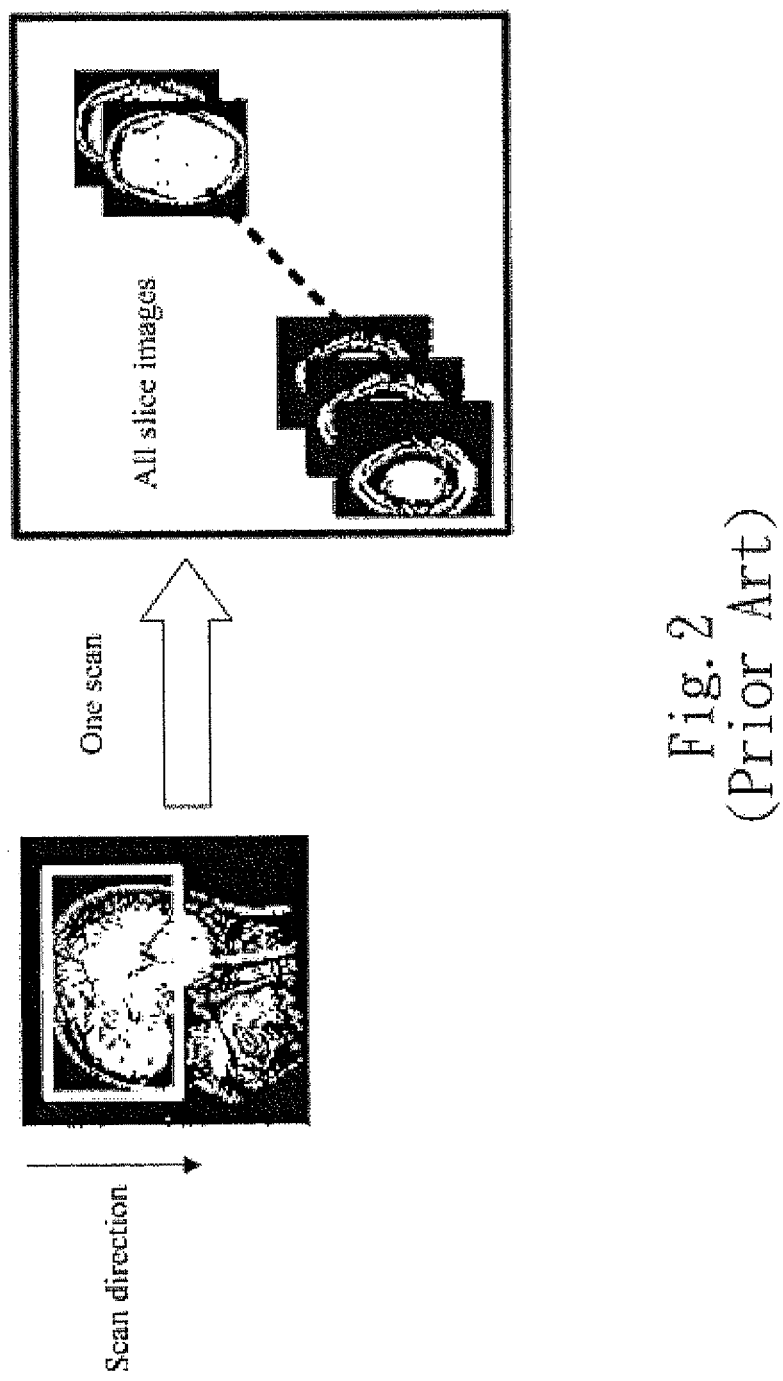
FIG. 2 is a schematic diagram, showing that, in a conventional procedure of 3D spatial encoding, only one single slab of the subject can be excited to give N images.
Figure 3:
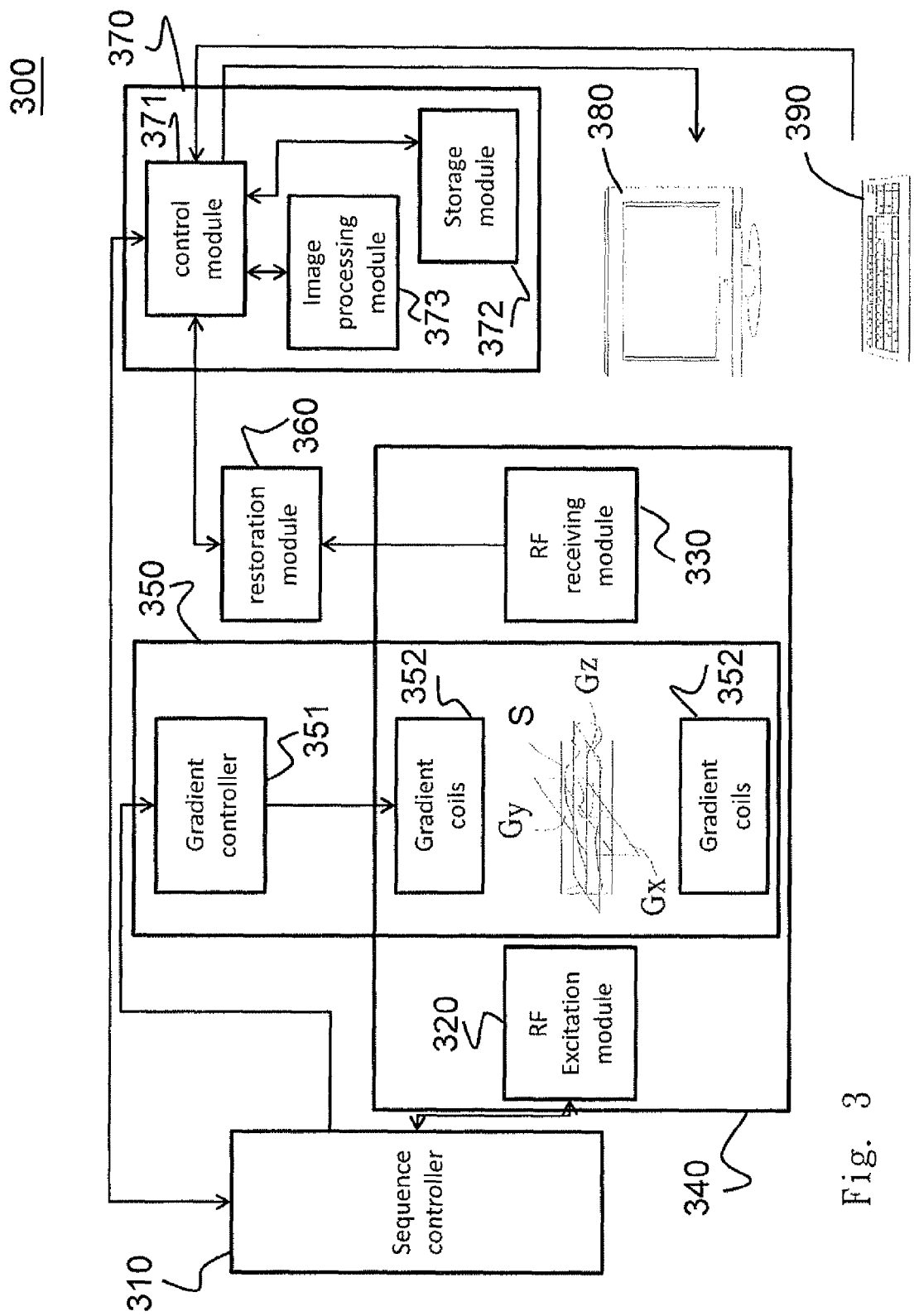
FIG. 3 is a diagram illustrating an exemplary apparatus for simultaneously acquiring multi-slice or multi-slab MRI signals from a subject in accordance with one embodiment.

FIG. 3 is a diagram illustrating an exemplary apparatus 300 for simultaneously acquiring multi-slice or multi-slab MRI signals from a subject in accordance with one embodiment, wherein the apparatus 300 is capable of imaging by generating a MRI signal from the subject.

Referring to FIG. 3, the imaging apparatus 300 comprises a sequence controller 310, an RF excitation module 320 for emitting an excited waveform, an RF receiving module 330 for receiving MR image signals, a static magnetic field output module 340, a gradient output module 350, a restoration module 360 and a main console 370. In one embodiment, the imaging apparatus 300 could further comprises a display device 380 and an input device 390.

The sequence controller 310 can be configured to output driving signals to drive the activation of the RF excitation module 320, the RE receiving module 330 and the gradient output module 350. The RF excitation module 320 and the RF receiving module 330 can each be an RF coil with either a single channel or multiple channels. The gradient output module 350 can be provided with a gradient controller 351 and a plurality of gradient coils 352. The restoration module 360 stores the signal restoration function to restore incoming signal according to the signal restoration function, wherein the signal restoration function could be the data transmitted from the main console 370 or computed by the restoration module 360, and the signal restoration function could be obtained from a simulation result. The main console 370 has a control module 371, a storage module 372 and an image processing module 373.

A subject S can be positioned within a measurement space. In the measurement space, there are a uniform magnetic field generated by the static magnetic field output module 340 and a gradient generated by the gradient coils 352, which is under the control of the gradient controller 351. The uniform magnetic field cooperating with the gradient is used for subject S to generate the magnetization as a source of the MRI signals. The method for imaging using the above apparatus is described below.

Figure 4:
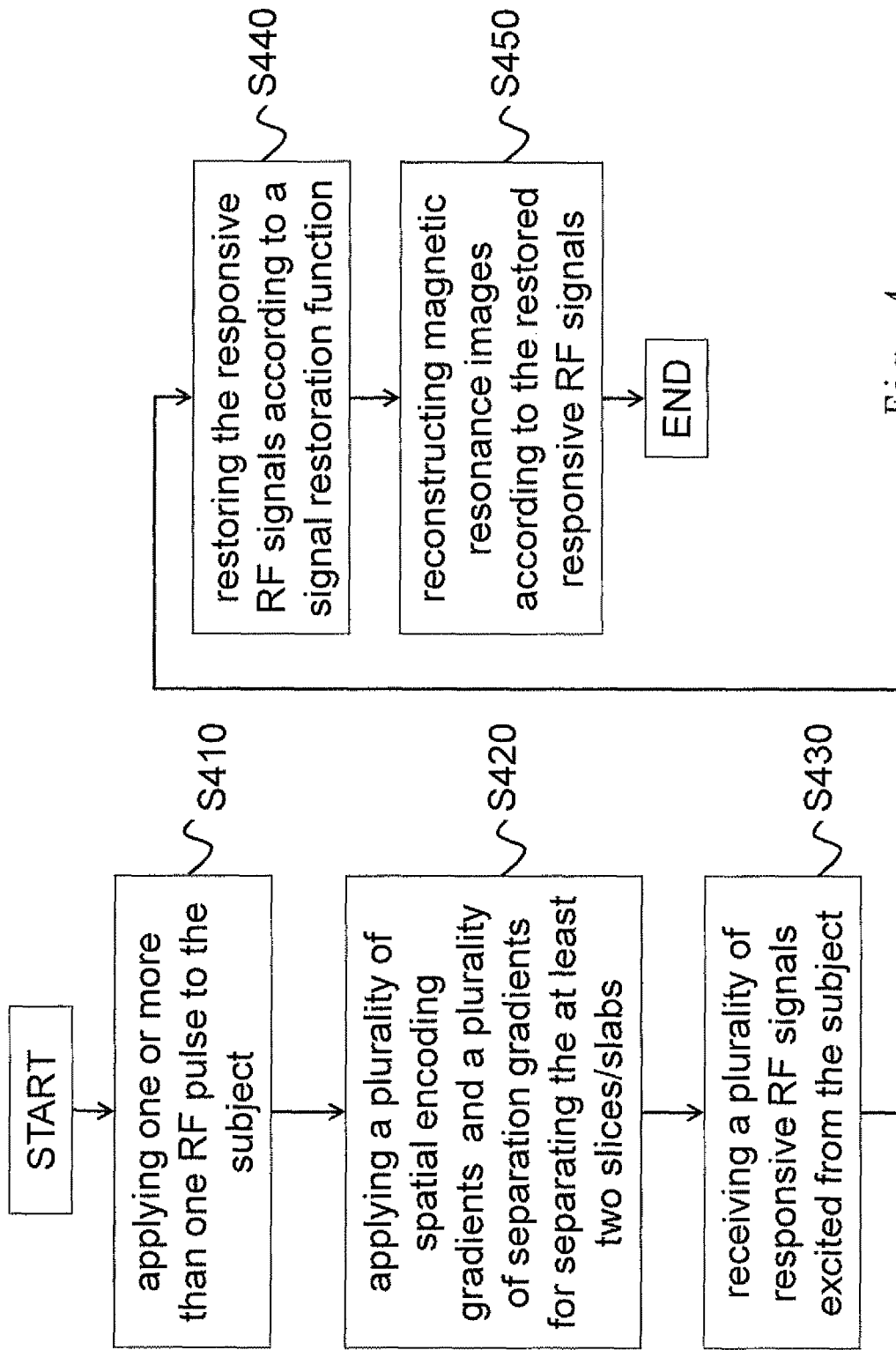
FIG. 4 is a flowchart illustrating an exemplary method for simultaneously acquiring multi-slice/multi-slab MRI signals from a subject in accordance with one embodiment.

FIG. 4 is a flowchart illustrating an exemplary method for simultaneously acquiring multi-slice/multi-slab MRI signals from a subject in accordance with one embodiment. The controller module 371 can be used for receive the control instructions sent by the user from the input device 390 and cooperates with a preset program stored in the storage module 372 to make the sequence controller 310 execute method of FIG. 4.

Referring to FIG. 3 and FIG. 4, in step S410, the RF excitation module 320 is controlled for applying one or more than one RF pulses, which carries at least two frequency components and a slice/slab selection gradient to the subject S, so that at least two slices/slabs of the subject S respectively corresponding to the at least two frequency components are excited simultaneously.

Figure 5:
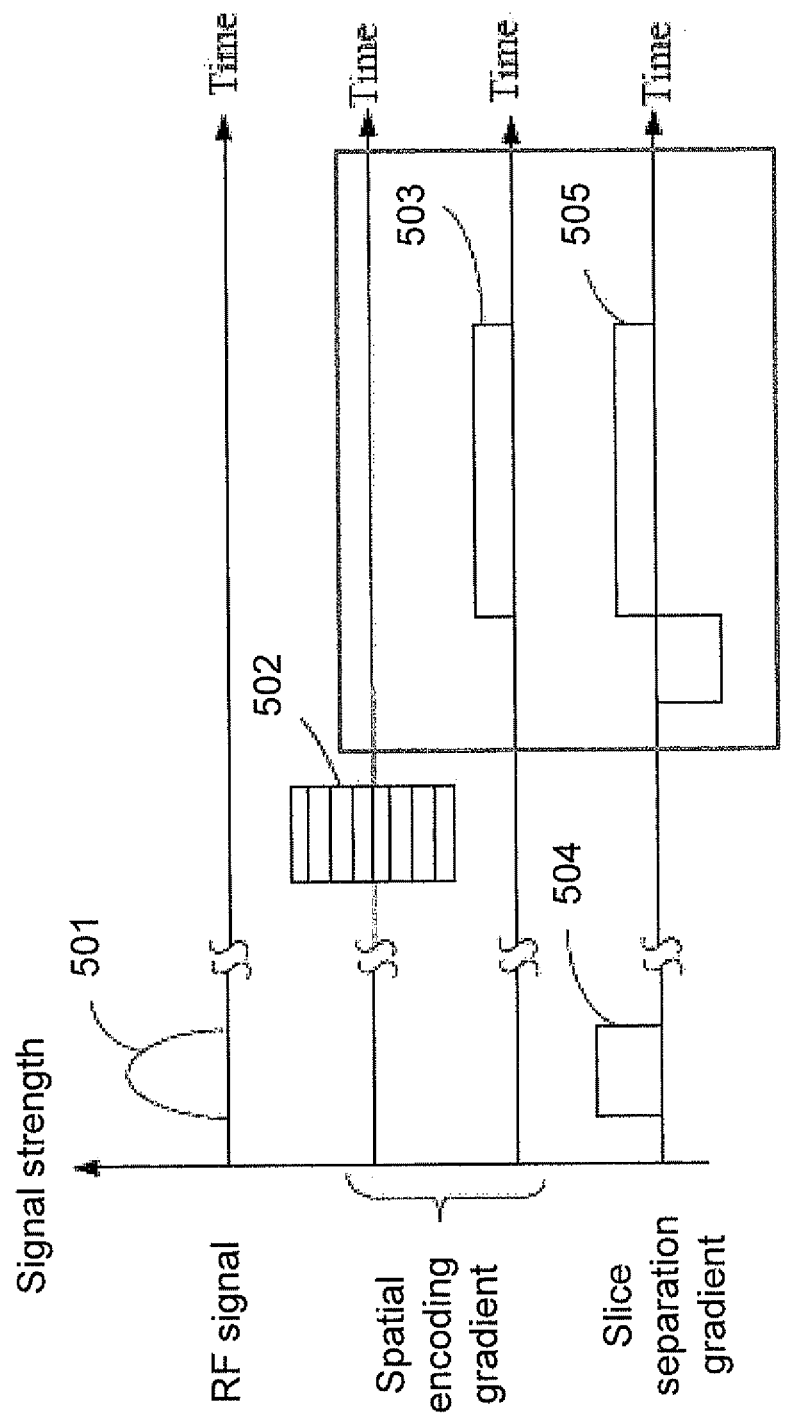
FIG. 5 shows timing diagram illustrating the control of the system of FIG. 3 when implementing the process of FIG. 4 for acquiring multi-slice MRI signals.
Figure 6:
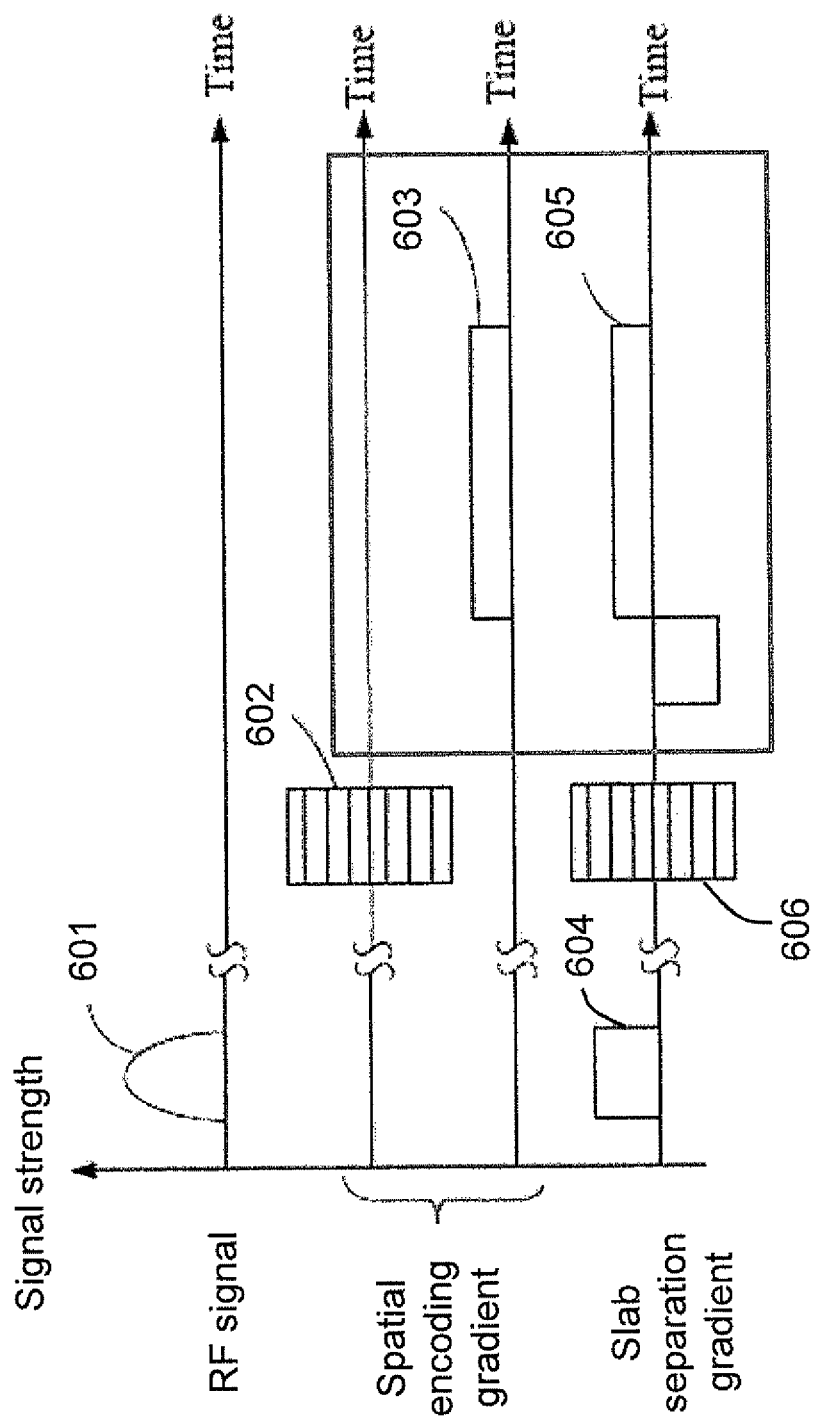
FIG. 6 shows timing diagram illustrating the control of the system of FIG. 3 when implementing the process of FIG. 4 for acquiring multi-slab MRI signals.

For example, referring to FIG. 5 and FIG. 6, these separately show timing diagram illustrating the control of the system of FIG. 3 when implementing the process of FIG. 4 for acquiring multi-slice MRI signals and multi-slab MRI signals. In one embodiment, the sequence controller 310 drives the RF excitation module 320 to generate to the subject S one or more than one RF pulse 501/601 that carries at least two frequency components, for example, the RF pulse 501 carries frequencies $f_1$ and $f_2$, which have a difference $f_{sep}$ meeting Eq. 2. The sequence controller 310 also drives the gradient controller 351 to control the gradient coils 352 for generating the slice-selection gradient $G_{ss}$ 504/slab-selection gradient $G_{ss}$ 604.

In one embodiment, the RF pulse 501 carrying frequencies $f_1$ and $f_2$ for exciting two slices/slabs has $f_1$ and $f_2$ designed to have a frequency difference $f_{sep}$ such that $$f_{sep} = d_{sep} \times \gamma \times G_{ss}. \quad \text{(Eq. 2)}$$

$d_{sep}$ denotes the absolute distance (in centimeters) between the two adjacent slices that correspond to the two frequencies, wherein two adjacent slices mean two neighboring slices excited by a plurality of frequencies carried by an RF pulse. $\gamma$ denotes the atomic gyromagnetic ratio. $G_{ss}$ denotes the intensity of the slice-selection gradient (in Gauss/centimeter).

In step S420, the gradient output module 350 applies to the subject S a plurality of spatial encoding gradients $G_{spen}$ and one or more than one slice/slab separation gradients $G_{sep}$ for separating at least two slices/slabs. The spatial encoding gradients $G_{spen}$ comprise a phase-encoding gradient $G_Y$ and a frequency-encoding gradient $G_X$.

The ratio of $G_{sep}$ to $G_{spen}$, which may be the phase-encoding gradient $G_Y$ or the frequency-encoding gradient $G_X$ and cooperates with $G_{sep}$ to receive MRI signals, should meet a relation as follows:

$$G_{sep}/G_{spen} \geq FOV_{spen}/d_{sep}. \quad \text{(Eq. 3)}$$

$FOV_{spen}$ denotes a field (e.g. width) (in centimeters) of view along the direction of the spatial encoding gradient $G_{spen}$. $d_{sep}$ denotes the absolute distance (in centimeters) between the two adjacent slices/slabs that correspond to the two frequencies. The two adjacent slices/slabs can be separated completely as demonstrated by Eq. 3.

For example, referring to FIG. 5 and FIG. 6, the sequence controller 310 drives the gradient controller 351 to control the plurality of gradient coils 352 for generating a plurality of spatial encoding gradient $G_{spen}$, such as 502/602 and 503/603, and one or more than one separation gradients $G_{sep}$, such as 505/605, to the subject S, with respect to each encoding direction for each slice/slab. For acquiring multi-slab MRI signals shown in FIG. 6, the sequence controller 310 drives the gradient controller 351 to control the plurality of gradient coils 352 for further generating a slab-selection gradient 606 to the subject S.

In step S430, the gradient output module 350, in the course of applying the spatial encoding gradients (phase-encoding gradient $G_Y$ and a frequency-encoding gradient $G_X$), cooperates with the RF receiving module 330 to receive a plurality of responsive RF signals excited from the subject S.

Figure 7:
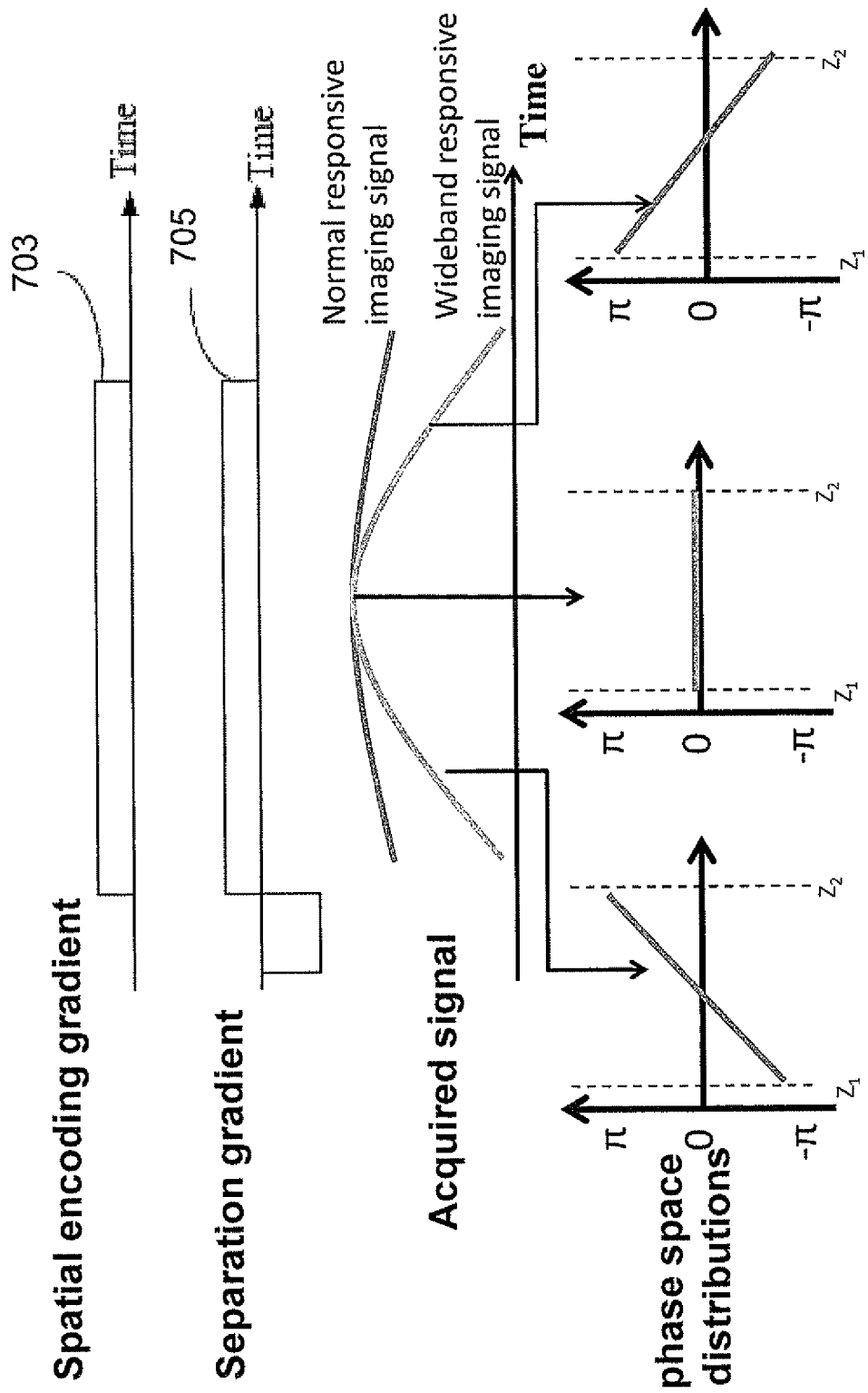
FIG. 7 shows the wideband and normal responsive imaging signals without restoring.

In step S440, the restoration module 360 is controlled for restoring the responsive RF signals according to a signal restoration function. For example, referring to FIG. 7, this shows the wideband and normal responsive imaging signals without restoring. When the spatial encoding magnetic field gradient 703 and the slice/slab separation magnetic field gradient 705 are applied, the responsive RF signals excited from the subject S are received; however, the time for acquiring signal is so long such that the phase space distributions of the responsive RF signals are not flat and the signal strengths of both ends in responsive RF signals are much lower than the center thereof.

In order to reduce the decay effect, the responsive RF signals are restored according to the signal restoration function. For example, referring to FIG. 8 which shows diagram of the procedure for restoring the responsive RF signals.

When the wideband responsive imaging signal is received, the responsive signal is restored according to the signal restoration function to obtain a restored signal, wherein the signal restoration functions is obtain according to the calculated/measured filter profile.

The calculated filter profile, for example, is obtained from a simulation result, such as through the filter shape calculated as follows:

$$S'(K_x, K_y) = S(K_x, K_y) \cdot \mathrm{sinc}\left(\gamma G_z \tau\left(\frac{th}{2}\right)\right) \cdot \exp[i\gamma G_z \tau Z_{cen}] \quad \text{(Eq. 4)}$$
$$= S(K_x, K_y) \cdot \mathrm{sinc}(\alpha k_x) \cdot \exp[i\beta k_x]$$

R denotes $G_z/G_x$, $K_x$ denotes the $\rho/G_X \tau$, $\rho$ denotes the $\gamma/(2\pi)$, $\alpha$ denotes $\pi$ Rth and $\beta$ denotes $2\pi R Z_{cen}$, wherein the sin c($\alpha k_x$) denotes the blur component and the exp[$i\beta k_x$] denotes the shift component.

The input parameters of calculated filter profile for filter shape calculation, for example, includes the gradient strength ratio R, effective slice thickness th and acquisition duration $T_{acq}$. The gradient strength ratio R, for example, is the ratio of separation gradient/spatial encoding gradient during signal acquisition. The effective slice thickness th, for example, is the slice thickness for 2D or the slab thickness/number of z encodings for 3D. The acquisition duration $T_{acq}$, for example, is the ratio of number of sampled points/acquisition bandwidth.

Figure 9:
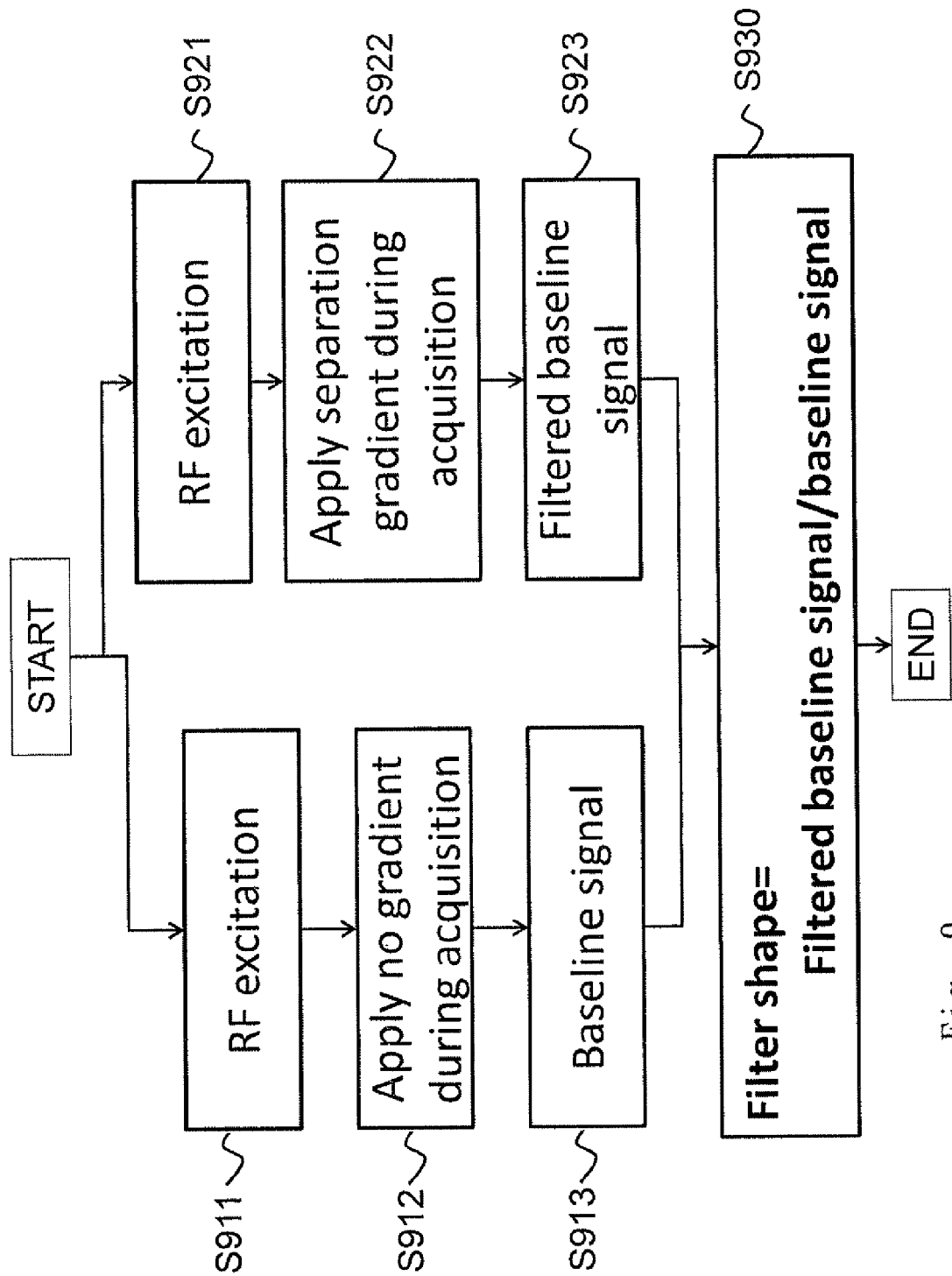
FIG. 9 shows the diagram of procedure for deriving the filter profile from measured signal.

The measured filter profile, for example, is obtained through the procedure shown in FIG. 9 which shows the diagram of procedure for deriving the filter profile from measured signal.

In step S911, RF excitation is applied, for example, one or more than one RF pulse is/are applied.

In step S912, no gradient is applied during acquisition, and the acquired signal is the baseline signal. For example, refers to table 1 which shows the relationship of measured image and signal. When spatial encoding gradient is applied, but separation gradient is not applied, the measured image is normal MR image. When spatial encoding gradient and separation gradient are all applied, the measured image is wideband MR image. When both the spatial encoding gradient and separation gradient are not applied, the acquired signal is the baseline signal. When spatial encoding gradient is not applied but the separation gradient is applied, the acquired signal is filtered baseline signal. The acquired signal will be an image only with spatial encoding gradient turned on.

TABLE 1

Relationship of measured image and signal

| | Spatial encoding gradient | Separation gradient |
|---|---|---|
| Normal MR image | ON | OFF |
| Wideband MR image | ON | ON |
| Baseline signal | OFF | OFF |
| Filtered baseline signal | OFF | ON |

In step S913, since there is no gradient is applied during step S912, the baseline signal is obtained.

In steps S921-S923, similar to steps S911-S913, the RF excitation is applied, however, only the separation gradient is applied within the steps of applying spatial encoding gradient and separation gradient such that the filtered baseline signal is obtained in step S923. In step S930, the measured filtered profile is obtained through the filter shape calculated as the ratio of filtered baseline signal/baseline signal.

Figure 8:
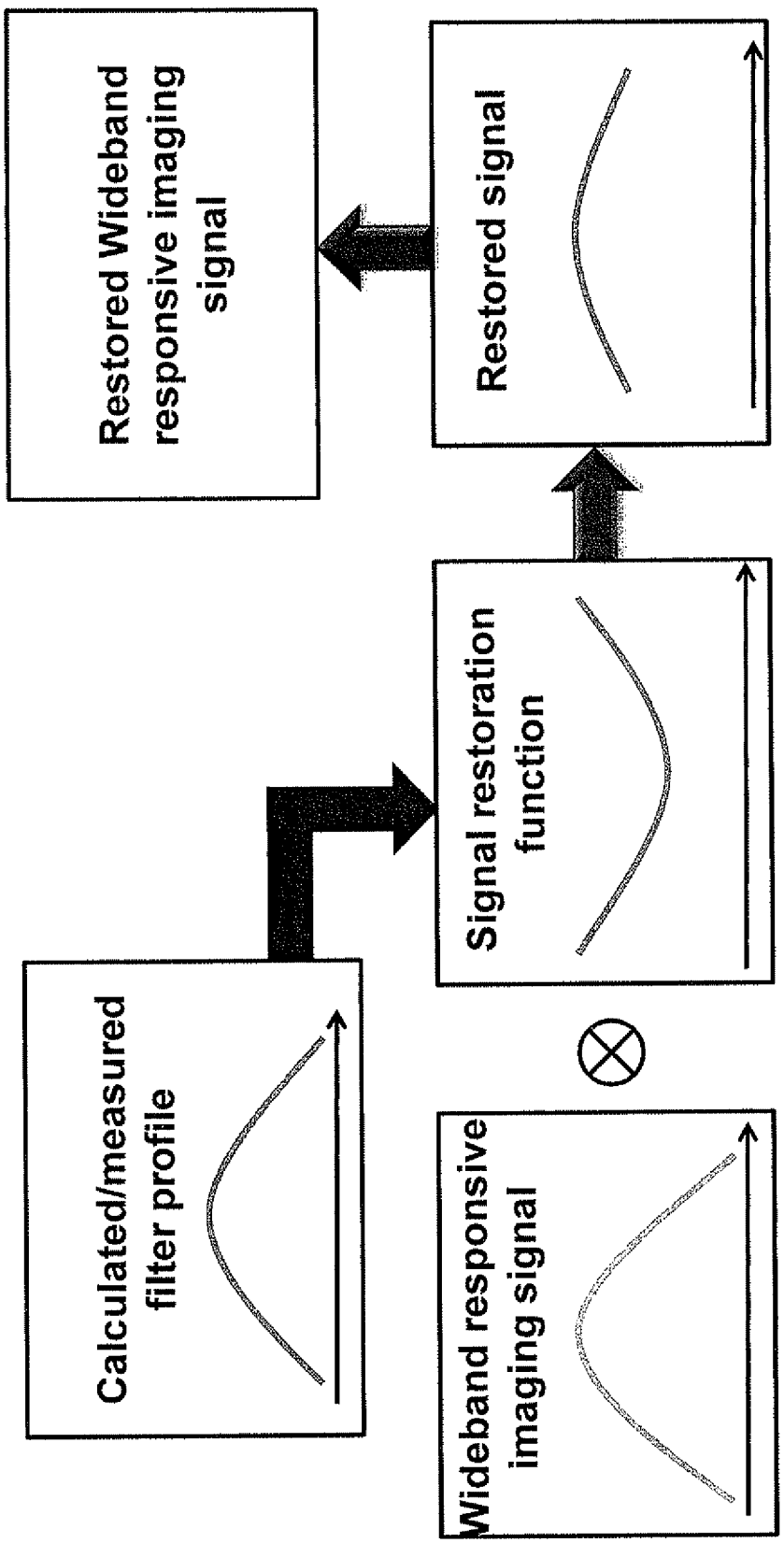
FIG. 8 shows diagram of the procedure for restoring the responsive RF signals.

Back to the procedure of FIG. 8, since the wideband responsive imaging signal is restored according to the signal restoration function obtained by the calculated/measured filter profile, the signal strengths of both ends in restored wideband responsive imaging signal are enhanced corresponding to the center thereof.

Back to the procedure of FIG. 4, in step S450, the MRI signals are reconstructed according to the restored responsive RF signals by the image processing module 373, for example, Fourier transform is applied to the restored responsive RF signals so as to give the real-time image of each slice/slab. For example, the RF receiving module 330 receives the MRI signals excited from the subject S while the spatial encoding gradient 503 and the at least one slice separation gradient 504 are applied. The responsive RF signals can then be restored by the restoration module 360. The restored responsive RE signals can be reconstructed by the image processing module 373 which performs transformation such as spatial encoding and 2D/3D Fourier transform so as to give the real-time image data of the slices/slabs. The reconstructed data, such as the images of the separated slices/slabs, can then be output to be displayed on display device 380.

The difference between 3D MRI and 2D MRI is that in the latter, one slice is excited in one scan and then the image information is given through 2D spatial encoding, whereas in the former one slab is excited in one scan and then the image information is given through 3D spatial encoding.

According to the procedure for simultaneously acquiring multi-slice/multi-slab MRI signals from a subject, wherein the responsive RF signals are restored according to the signal restoration function, so the reconstructed magnetic resonance images is clearer than the magnetic resonance images obtained by the responsive RF signals without restoring. Therefore, the method and apparatus for enhancing signals in wideband magnetic resonance imaging (MRI) of the disclosure at least has the feature of "enhance the image resolution".

In another embodiment, back to the procedure of FIG. 4, the step of applying spatial encoding gradients and separation gradients could further comprises: the gradient output module 350 further applies to the subject S at least one coherent refocusing gradient between the plural ones of separation gradients.

Figure 10:
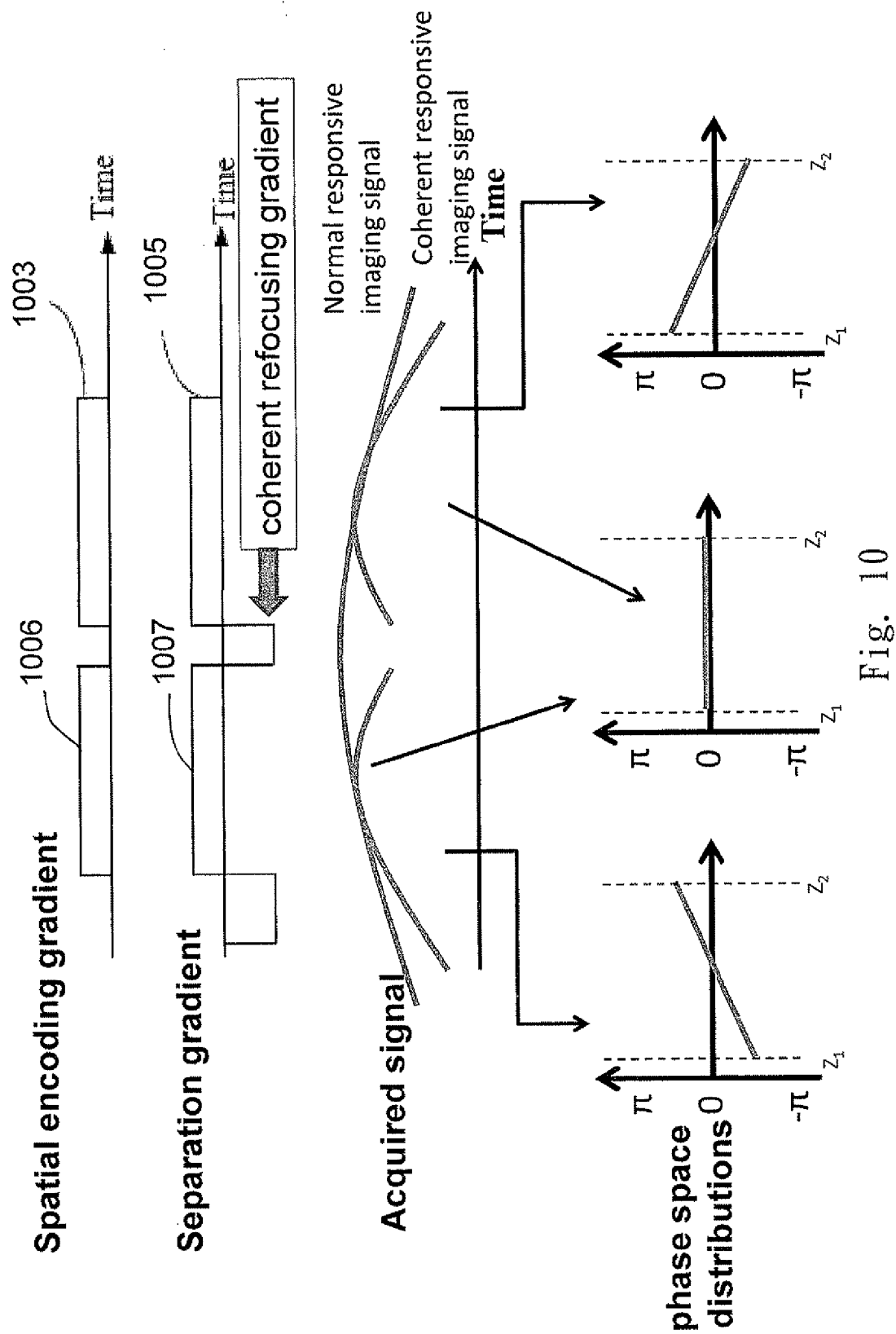
FIG. 10 shows the normal responsive imaging signal and the coherent responsive imaging signal without restoring.

For example, refers to FIG. 10, this shows the normal responsive imaging signal and the coherent responsive imaging signal without restoring. In this embodiment, the sequence controller 310 further drives the gradient controller 351 to control the gradient coils 352 for generating to the subject S the spatial encoding gradient $G_{spen}$ 1003 and 1006, the separation gradients $G_{sep}$ 1005 and 1007, and the at least one coherent refocusing gradient between the separation gradients $G_{sep}$ 1005 and 1007.

By applying the at least one coherent refocusing gradient, there are two peak in the coherent responsive imaging signal relative to the normal responsive imaging signal with one peak shown in FIG. 10, and the signal restoration function corresponding to signal with coherent refocusing gradient would be different from the signal restoration function corresponding to signal without the coherent refocusing gradient.

Figure 11:
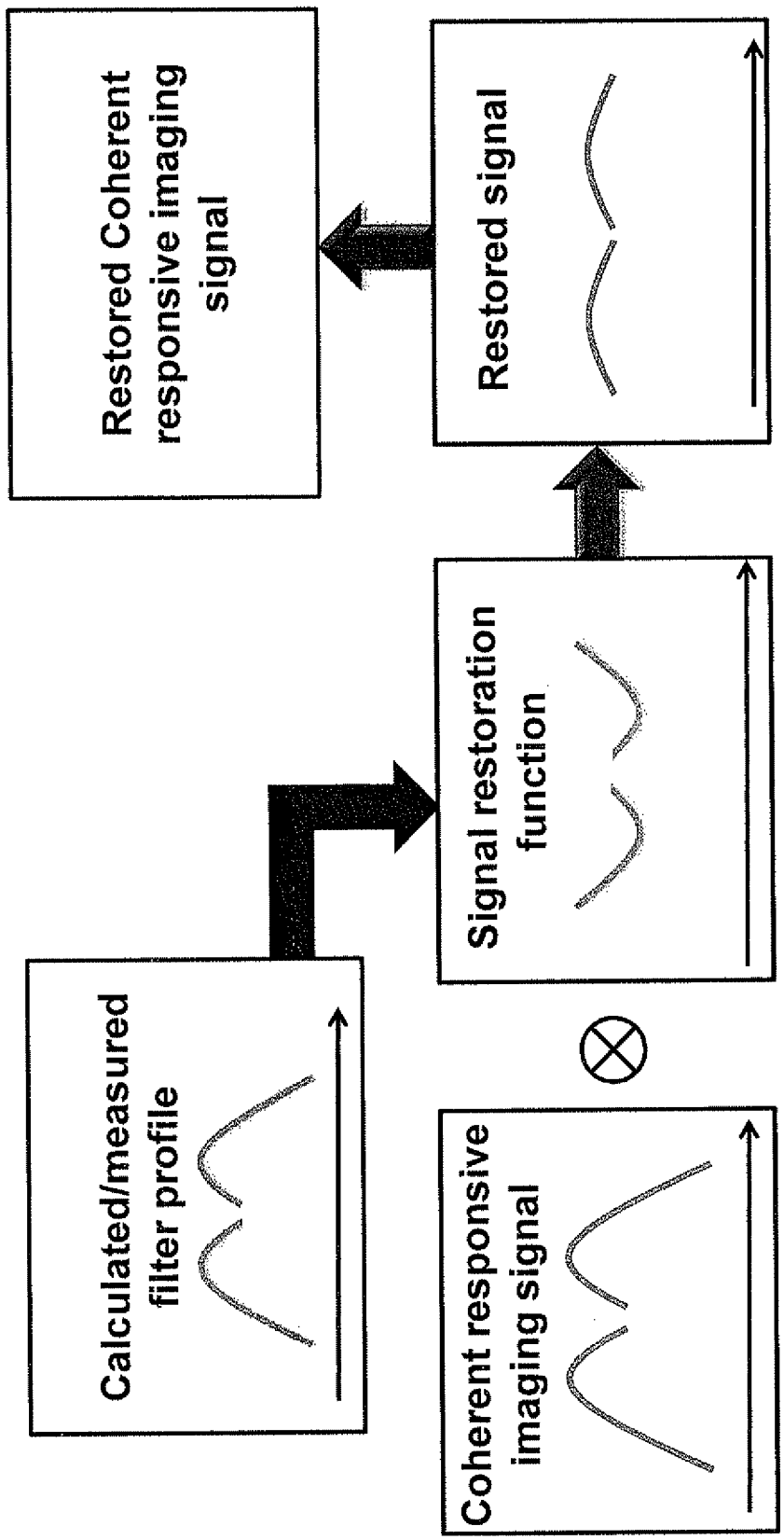
FIG. 11 shows the diagram of the procedure for restoring the coherent responsive RF signals.

For example, refers to FIG. 11, this shows the diagram of the procedure for restoring the coherent responsive RF signals. It is clear that there are two peak in the coherent responsive imaging signal relative to the normal responsive with one peak, as a result, the calculated/measured filter profile is corresponding to the coherent responsive imaging signal, and the signal restoration function is adjusted in accordance with the calculated/measured filter profile, then the signal strengths of both ends in each peak of restored coherent responsive imaging signal are enhanced corresponding to the center thereof.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for enhancing signals in magnetic resonance imaging (MRI), comprising:
    applying one or more than one RF pulse, which carries at least two frequency components, and a slice/slab selection gradient to a subject, so that at least two slices/slabs of the subject respectively corresponding to the at least two frequency components are excited simultaneously;
    applying a plurality of spatial encoding gradients and one or more than one separation gradients for separating the at least two slices/slabs;
    receiving a plurality of responsive RF signals excited from the subject; and
    restoring the responsive RF signals based on a restoration function in order to undo the signal attenuation caused by the separation gradients.

2. The method for enhancing signals in MRI of claim 1, wherein the signal restoration function is obtained from a simulation result.

3. The method for enhancing signals in MRI of claim 2, wherein the simulation result is obtained according to the ratio of the separation gradients/the spatial encoding gradients, the effective slice thickness, and an acquisition duration.

4. The method for enhancing signals in MRI of claim 1, wherein the signal restoration function is obtained from a measured result.

5. The method for enhancing signals in MRI of claim 4, wherein the method of obtaining the measured result comprising:
    applying one or more than one RF pulse to obtain a baseline signal; and
    applying one or more than one RF pulse and the separation gradients to obtain a filtered baseline signal.

6. The method for enhancing signals in MRI of claim 1, further comprising:
    reconstructing magnetic resonance images according to the restored responsive RF signals.

7. The method for enhancing signals in MRI of claim 1, further comprising:
    applying at least one coherent refocusing gradient between the plural ones of separation gradients.

8. An apparatus for simultaneously acquiring multi-slice/slab MRI images from a subject, the apparatus being capable of imaging by generating a MRI signal from the subject, the apparatus comprising:
    an RF excitation module, being controlled for applying one or more than one RF pulse, which carries at least two frequency components, and a slice/slab selection gradient to the subject, so that at least two slices/slabs of the subject respectively corresponding to the at least two frequency components are excited simultaneously;
    a gradient output module for applying a plurality of spatial encoding gradients and one or more than one separation gradients for separating the at least two slices/slabs;
    an RF receiving module for receiving a plurality of responsive RF signals excited from the subject; and
    a restoration module for restoring the responsive RF signals according to a signal restoration function in order to undo the signal attenuation caused by the separation gradients.

9. The apparatus for acquiring MRI images of claim 8, wherein the signal restoration function is obtained from a simulation result.

10. The apparatus for acquiring MRI images of claim 9, wherein the simulation result is obtained according to the ratio of the separation gradients/the spatial encoding gradients, the effective slice thickness, and an acquisition duration.

11. The apparatus for acquiring MRI images of claim 8, wherein the signal restoration function is obtained from a measured result.

12. The apparatus for acquiring MRI images of claim 11, wherein the measured result is obtain according to a baseline signal and a filtered baseline signal, wherein the baseline signal is obtained by applying only one or more than one RF pulse, and the filtered baseline signal is obtained by applying one or more than one RF pulse and the separation gradients.

13. The apparatus for acquiring MRI images of claim 8, further comprising:
    an image processing module for reconstructing magnetic resonance images according to the restored responsive RF signals.

14. The apparatus for acquiring MRI images of claim 8, wherein the gradient output module further applying at least one coherent refocusing gradient between the plural ones of separation gradients.

* * * * *